United States Patent
Li et al.

(10) Patent No.: US 7,101,743 B2
(45) Date of Patent: Sep. 5, 2006

(54) LOW COST SOURCE DRAIN ELEVATION THROUGH POLY AMORPHIZING IMPLANT TECHNOLOGY

(75) Inventors: Yisuo Li, Singapore (SG); Francis Benistant, San Jose, CA (US); Kian Meng Tee, Singapore (SG); King Jien Chui, Singapore (SG)

(73) Assignee: Chartered Semiconductor Manufacturing L.T.D., Singapore (SG)

( * ) Notice: Subject to any disclaimer, the term of this patent is extended or adjusted under 35 U.S.C. 154(b) by 372 days.

(21) Appl. No.: 10/752,249

(22) Filed: Jan. 6, 2004

(65) Prior Publication Data

US 2005/0148125 A1   Jul. 7, 2005

(51) Int. Cl.
*H01L 21/336* (2006.01)
*H01L 21/8234* (2006.01)

(52) U.S. Cl. .................................. 438/197; 438/655

(58) Field of Classification Search ................ 438/197, 438/592, 595, 630, 655, 664, 682
See application file for complete search history.

(56) References Cited

U.S. PATENT DOCUMENTS 5,583,064 A    12/1996  Lee et al.
5,618,755 A *  4/1997   Ito ........................ 438/592
6,207,540 B1   3/2001   Furukawa et al.
6,303,449 B1   10/2001  Pan et al.
6,406,951 B1   6/2002   Yu
6,531,781 B1   3/2003   Tseng
6,806,190 B1 * 10/2004  Lin ........................ 438/682

OTHER PUBLICATIONS

Ranade et al., "A novel elevated S.D PMOSFET Formed by Ge-B/Si Intermixing", IEEE electron device letters, vol. 23, No. 4, Apr. 2002. pp. 218-220.

* cited by examiner

*Primary Examiner*—Phuc T. Dang
(74) *Attorney, Agent, or Firm*—William J. Stoffel

(57) ABSTRACT

A method for forming elevated source/drain regions. A gate structure is formed over a substrate. The substrate comprised of silicon. We form a polysilicon layer preferably using PVD or CVD over the gate structure and the substrate. A poly/Si interface is formed between the polysilicon layer and the substrate. We perform a poly/Si interface amorphization implant to amorphize at least the poly/Si interface in the S/D areas and to from an amorphous region. We anneal the substrate to crystallize the amorphous region and the polysilicon layer over the amorphous region to form an elevated silicon region in the source/drain area. Next, source/drain regions in are formed in the elevated silicon regions and the substrate.

13 Claims, 5 Drawing Sheets

LOW COST SOURCE DRAIN ELEVATION THROUGH POLY AMORPHIZING IMPLANT TECHNOLOGY

BACKGROUND OF INVENTION

1) Field of the Invention

This invention relates generally to fabrication of semiconductor devices and more particularly to the fabrication of elevated source and drain regions.

2) Description of the Prior Art

An important objective in the constant advancement of IC (Integrated Circuit) technology is the scaling-down of IC. dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

A major challenge is the formation of raised source and drain regions in a MOS device. In order to make shallower junctions with low sheet resistance, source drain elevation is preferred. Many techniques are known for forming raised source and drain regions as evidenced by the references. The closest and apparently more relevant technical developments in the patent literature can be gleaned by considering U.S. Pat. No. 6,531,781b2 (Tseng) shows an elevated S/D process using a doped amorphous Si layer.

U.S. Pat. No. 6,303,449B1 (Pan et al.) teaches an elevated S/D process using a poly dep and chemical-mechanical polish (CMP).

U.S. Pat. No. 5,583,064 (Lee et al.) shows another raised S/D process.

U.S. Pat. No. 6,406,951 (Yu) shows a raised S/D process using an epi layer.

Ranade et al., "A novel elevated S.D PMOSFET Formed by Ge-B/Si Intermixing", IEEE electron device letters, vol. 23, No. 4, April 2002. pp. 218–220.

U.S. Pat. No. 6,207,540B1 (Furukawa et al.) shows an elevated S/D process.

However, there is a need for an improved method for an elevated S/D region.

SUMMARY OF THE INVENTION

It is an object of the present invention to provide a method for fabricating raised source and drain structures.

Embodiments of the present invention provides a method of manufacturing raised source and drain regions which is characterized as follows.

We form a gate structure over a substrate; the substrate comprised of silicon. A polysilicon layer is formed over the gate structure and the substrate to form a polysilicon/Si interface between the polysilicon layer and the substrate. Source/drain areas are in the polysilicon layer and the substrate adjacent to the gate structure. We perform a poly/Si interface amorphization implant to amorphize at least the polysilicon/Si interface in the source/drain areas and to from an amorphous regions. Then the substrate is annealed to crystallize the amorphous region and the polysilicon layer over the amorphous regions to form elevated silicon regions. We form elevated source/drain regions in the elevated silicon regions. Silicide regions are formed on the elevated silicon regions.

The embodiment's poly/Si interface amorphization implant improves tht quality of the crystalline elevated silicon regions.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1, 2A, 3A, 4A and 5A, are cross sectional views for illustrating a method for forming elevated source drain regions according to an example embodiment of the present invention. In a first embodiment shown in a PVD process is used to form the poly layer.

FIGS. 3C-1 and 3C-2 show a feature where the poly/Si interface 29 is converted into amorphized Si with the amorphizing implant of an embodiment. FIG. 3C-*shows* an option where most of the poly layer 30B is converted to the Amorphous silicon region 32. FIGS. 3C-2 shows an option where the amorphous region 32 centered around the poly/Si interface 29.

FIGS. 1, 2B, 3B, 4B and 5B are cross sectional views for illustrating a method for forming elevated source drain regions according to an second example embodiment of the present invention. In the second example embodiment a CVD process is used to form the poly layer.

DETAILED DESCRIPTION OF THE PREFERRED EMBODIMENTS

Example embodiments of the present invention will be described in detail with reference to the accompanying drawings. Example embodiments of the present invention provides a method of forming elevated S/D regions.

In an aspect of the invention, a polysilicon (poly) layer is formed over a Si Substrate. An amorphizing implant process is used to amorphize the polysilicon—Si substrate (poly/Si) interface. An anneal is used to crystallize the amorphous region and the poly layer to form the raised crystalline silicon regions. There are two embodiments for the processes to form the polysilicon layer.

In a first embodiment shown in FIGS. 2A, 3A, 3C-1. 3C-2, 4A, and 5A a PVD process is used to form the poly layer 30A 30B. In a second embodiment shown in FIGS. 2B, 3C-1. 3C-2, 3B, 4B and 5B, a CVD process is used to form the poly layer 30A 30B 30C.

First Example Embodiment

Form Gate Structure 25

Figure 1:
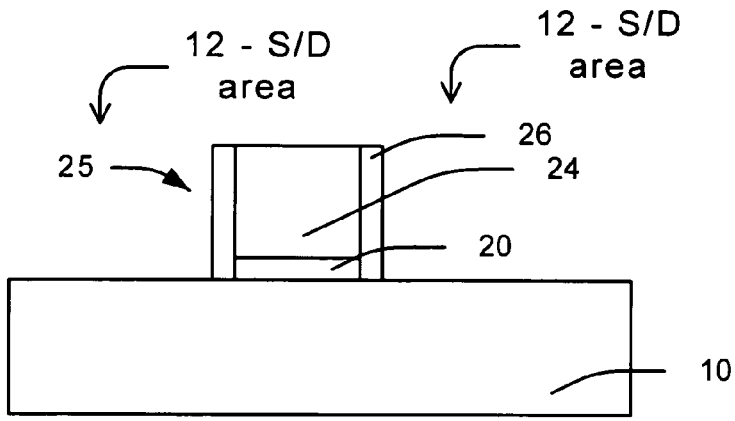
FIG. 1 is a cross sectional views for illustrating a method for forming elevated source drain regions according to an example embodiment of the present invention.

Referring to FIG. 1, a gate structure 25 (e.g., 20 24 26) is formed on the substrate preferably by the following. We form a gate dielectric layer and gate electrode layer (not shown) over substrate 10. The gate electrode layer can be comprised of poly.

The substrate 10 can be a silicon wafer. The substrate can be any semiconductor substrate used in semiconductor manufacturing, such as silicon on insulator (SOI) substrates. The substrate is preferably a crystalline silicon wafer with a {001} crystal orientation.

As shown in FIG. 1, we pattern a gate dielectric layer and a gate electrode (e.g., poly) layer to form gate dielectric 20 and gate electrode 24.

The gate dielectric layer can be comprised of oxide and preferably has a thickness between 15 and 120 Å.

The gate electrode is preferably comprised of polysilicon and preferably had a thickness between 1000 and 4000 Å and more preferably of about 1600 Å.

The gate 24 preferably has a width between 0.1 µm and 100 µm and more preferably between 0.13 and 20 µm.

After the gate structure 25 is formed, a LDD region (not shown) can be formed in the substrate using an implant.

As shown in FIG. 1, we form dielectric spacers 26 on the sidewalls of the gate dielectric 20 and gate 24. The spacers can be formed by first depositing a TEOS oxide layer and second, dry etching the TEOS oxide. Because of the anisotropic etching, the sidewall spacer is formed.

Source and drain areas (or regions) 12 are adjacent to the gate structure 20 24 26.

Two Embodiments to Form the Polysilicon Layer

As described next, a solid phase epitaxy process and amorphizing implant process are used to form the raised S/D regions. Solid phase epitaxy (SPE) is done by first depositing by physical vapor deposition (PVD), chemical vapor deposition (CVD) or other methods to form an amorphous film of material on the single crystal substrate. The substrate is then heated at ambient pressure to transform the amorphous film into a single crystal film.

There are two embodiments for the processes to form the polysilicon layer. In a first embodiment shown in FIGS. 1, 2A, 3A, 4A and 5A, a PVD process is used to form the poly layer. In a second embodiment, shown in FIGS. 1, 2B, 3B, 4B and 5B, a chemical vapor deposition (CVD) process is used to form the poly layer.

Deposit Poly Layer Using PVD Over Gat and Substrate.

Figure 2A:
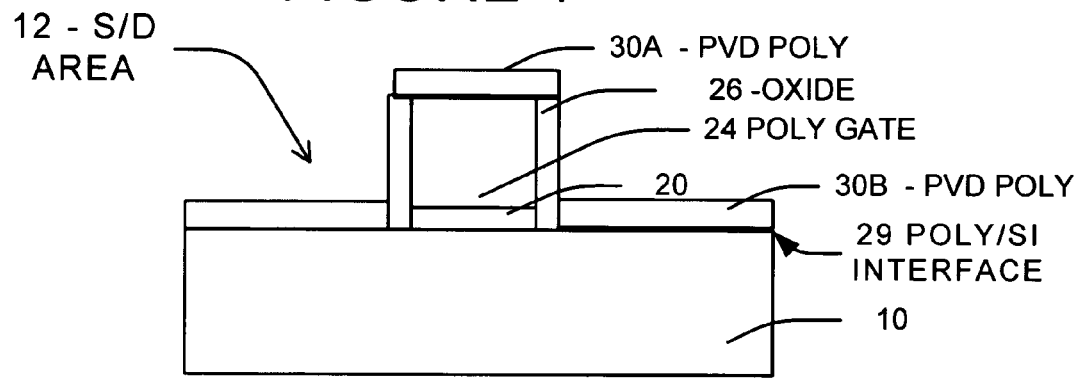

As shown in FIG. 2A, we form a polysilicon or amorphous layer 30A 30B over the substrate surface and gate. The poly layer is preferably deposed using a PVD process. The PVD process is a directional deposition process and does not deposit poly on the sidewalls of the gate structure.

For PVD, there are mainly two methods, one is evaporation, the other is sputter deposition. Sputter deposition is used often. Ar+ is used to bombard the silicon substrate.

For PVD process, the polysilicon layer 30A 30B is preferably undoped due to the process limitation. The poly layer can be doped and then act as a doping diffusion source for the s/d regions in the substrate. However, it is preferred that the Source/Drain doping be performed in a subsequent implant step.

The poly layer preferably has a thickness between 200 Å and 2000 Å.

LDD regions can be form by an implant process prior to the amorphizing implant.

Amorphizing I/I (AI) to Amorphize the Si/Poly Interface

Figure 3A:
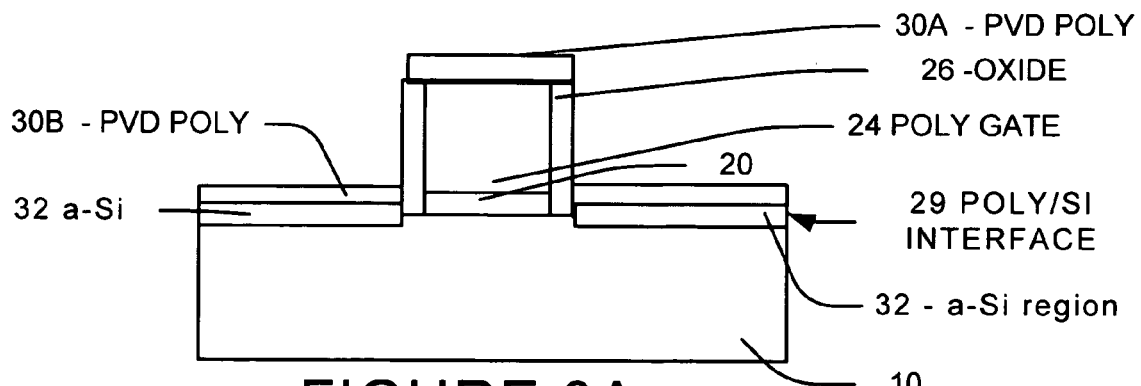

As shown in FIG. 3A, in a key step, an amorphization implant is performed to create amorphous Si regions 32 in the source/drain areas 12 that consume the poly/Si interface 29. The amorphization implant can also create an amorphous region (not shown) in the gate electrode 24.

Prior to the an amorphization implant, an optional "native oxide amorphization" implant is performed to break up the native oxide.

This important amorphizing implant allows for superior crystalline elevated S/D to form from the amorphous region 32 and the poly layer 30B (See FIG. 3A).

The Si/Poly interface amorphizing implant amorphizes the interface between polysilicon and silicon substrate in the source drain areas 12. The implant also amorphizes the poly 30A over the gate structure 25.

Amorphizing Implantation can use Si, Ge or As ions at a dose preferably higher than 1E15 ions/sq-cm in order to fully amorphize the interface between polysilicon and silicon. For example the following ions preferably have the doses: Si—dose 1E15 ions/sq-cm, Ge—1E14 ions/sq-cm or As-2E14 ions/sq-cm. Implantation energy is related to the depth of polysilicon deposition.

For example, for a 400 Å polysilicon/Si interface depth (e.g., poly 30B thickness), an As amorphizing implant can have an energy between 0.5 and 180 keV and preferably of about 50 keV and a dose between 2E14 and 6E16 ions/cc and more preferably about 2E 15 ions/sq-cm and about 0 degree tilt and about 0 degree twist. An N-type ion would only be used for a NMOS device.

In order to save mask steps, germanium or silicon implantation can be used. For example, for a 400 Å polysilicon/Si interface depth (e.g., poly 30B thickness), an amorphizing implant with Ge comprises a dose between 2E14 and 6E16 ions/sq cm and preferably about 2E15 ions/sq-cm and energy between 40 keV and 400 keV and more preferably at about 50 keV and about 0 degree tilt and about 0 degree twist, and a temperature of about room temperature. The implant preferably minimizes lateral channeling.

The amorphizing implant be optimized by minimizing channeling by position the peak position of the profile for the implanted species.

Combined S/D Doping Process and Poly/Si Amorphization Implant Step

The S/D doping process can be performed in the poly/Si amorphization implant step. The implant can be a two step implants or one step implant. For example, a two step amorphization and S/D doping implant can be a: (1) As implant with dose of 1E15 ions/sq-cm & energy of 90 keV; and (2) As implant with a dose about 1E15 ions/sq-cm, and energy about 90 keV.

A one step implant, for example, can comprise a As species at a dose of 2E15 ions/sq-cm and at an energy about 80 keV.

The embodiment's Amorphization Implant improves the single crystalline elevated S/D. A screen oxide forms the surface of the silicon so that the substrate surface has a little oxide layer even at room temperature. If another amorphous layer is deposited thereover, the screen oxide will depress the formation of solid phase epitaxy. For the embodiments, there is nothing between the amorphous Si and Substrate Si. So the Solid phase epitaxy will be formed smoothly.

Example Thickness and Placement of the Amorphized Region

An important feature of the embodiment is that the poly/Si interface 29 is converted into amorphized Si with the amorphizing implant. See FIGS. 3C-1 and 3C-2.

Figure 3B:
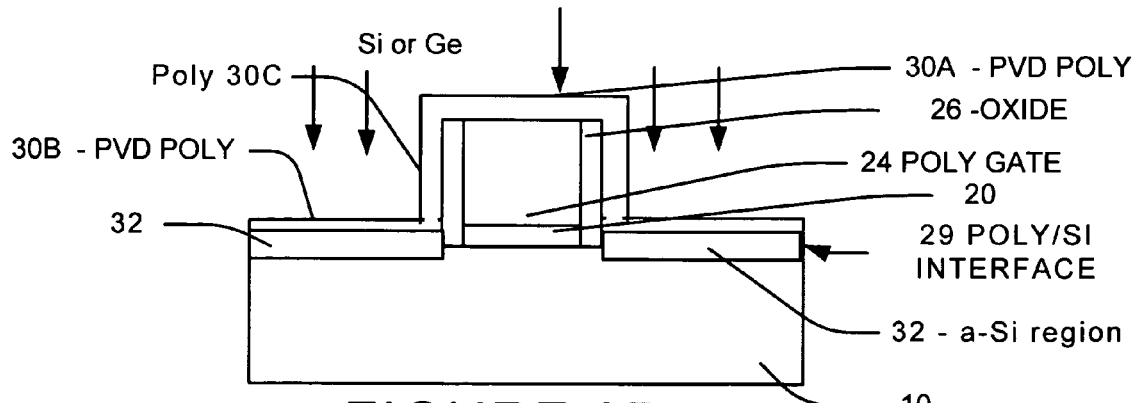
Figures 1, 3C:
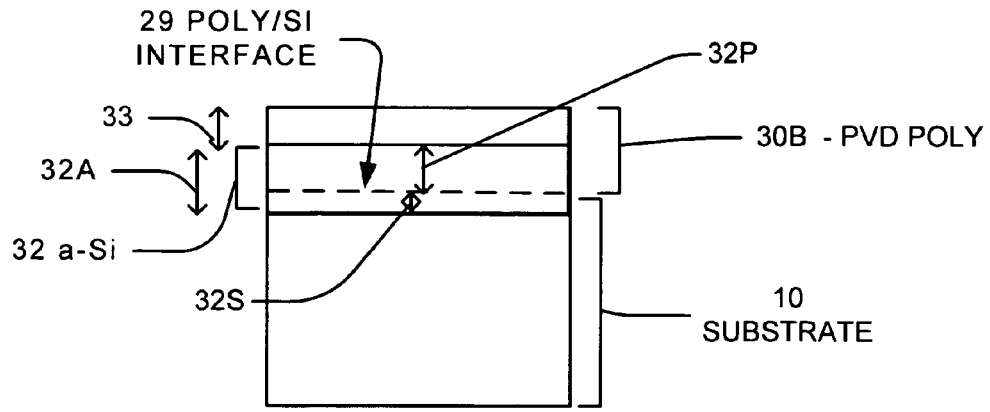

FIGS. 3C-1 shows an option where most of the poly layer 30B is converted to the Amorphous silicon region 32.

Figures 2, 3C:
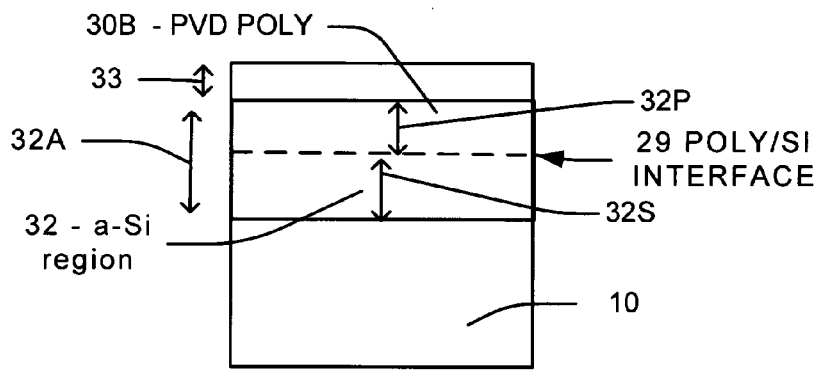

FIGS. 3C-2 shows an option where the amorphous region 32 is centered around the poly/Si interface 29.

The preferred amorphous region position depends on the device being fabricated. A deep junction depth is needed to lower sheet resistance.

Preferred Amorphizing Region Parameters

In a preferred process, the amorphizing implant converts a thickness 32S between 50 and 100 Å of the Si substrate 10 below the poly/Si interface 29 into amorphous Si.

Referring to FIGS. 3C-2, the amorphized Si region 32 has a depth 33 below the poly surface of between 0 Å and 1900 Å (preferably the polysilicon 30B thickness minus about 100 Å). In fact it is related to the polysilicon depth.

Referring to FIGS. 3C-1, the amorphized Si region 32 has a thickness 32A preferably between 100 and 1000 Å.

The thickness 32S of the silicon substrate that is amorphized is preferably between 50 and 950 Å. The thickness 32P of the poly layer 30B that is amorphized is preferably between 50 and 950 Å.

Referring to FIGS. 3C-2, the amorphized Si region 32 has a depth 33 below the poly surface of between 0 Å and 1900 Å (the polysilicon 30B thickness minus about 100 Å).

In a preferred process, referring to FIGS. 3C-1, the amorphized Si region 32 has a thickness 32A preferably of 200 Å. The thickness 32S of the silicon substrate that is amorphized is preferably 100 Å. The thickness 32P of the poly layer 30B that is amorphized is preferably 100 Å.

Anneal

Figure 4A:
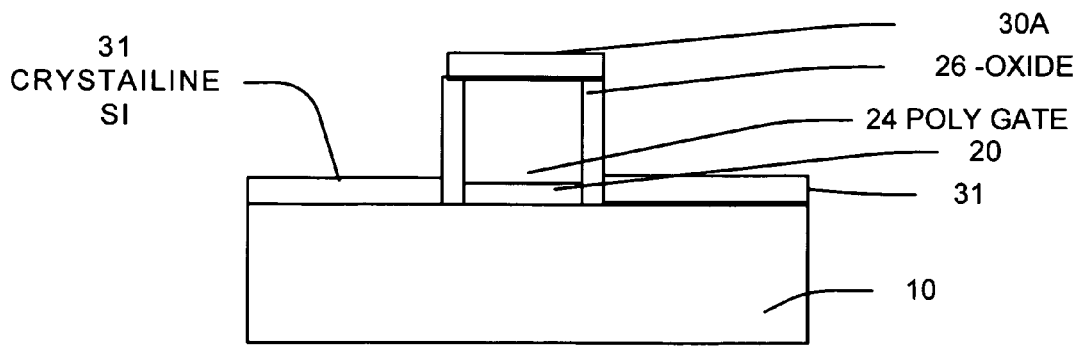

As shown in FIG. 4A, the substrate is annealed. The anneal converts amorphous Si 32 over the crystalline Si substrate 10 and the polysilicon 30B to raised crystalline silicon regions 31. The raised crystalline Si regions 31 will be used form the raised source and drain regions 31. The poly layer 30A can be also converted to crystalline Si. The raised crystalline Si regions 31 preferably have a thickness between 200 and 500 Å.

The anneal is preferably at a temperature between 500 and 1100° C. and more preferably about 650° C. The anneal is preferably at a time between 10 min and 60 min and most preferably between 200 and 500 Å.

The raised crystalline regions 31 preferably have a thickness between 100 Å and 2000 Å.

Subsequent Process

Figure 5B:
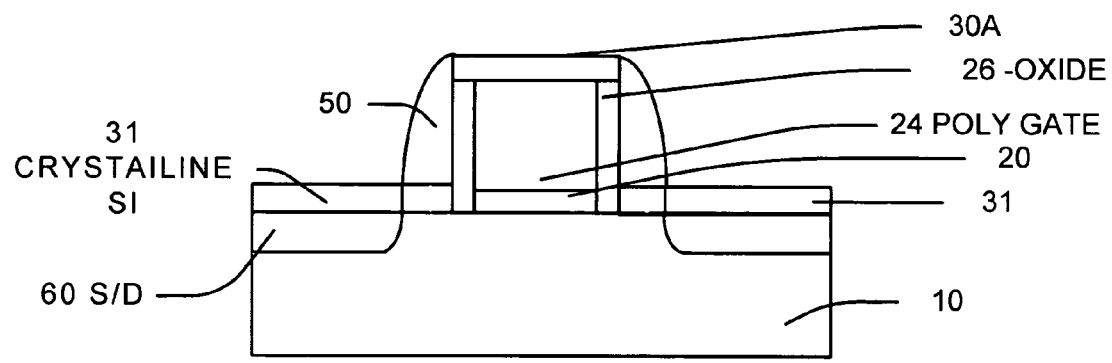
Figure 5A:
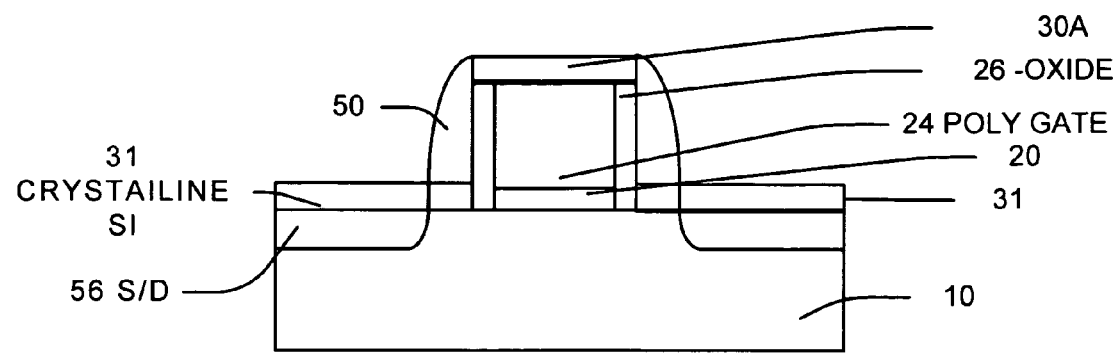
Figure 6A:
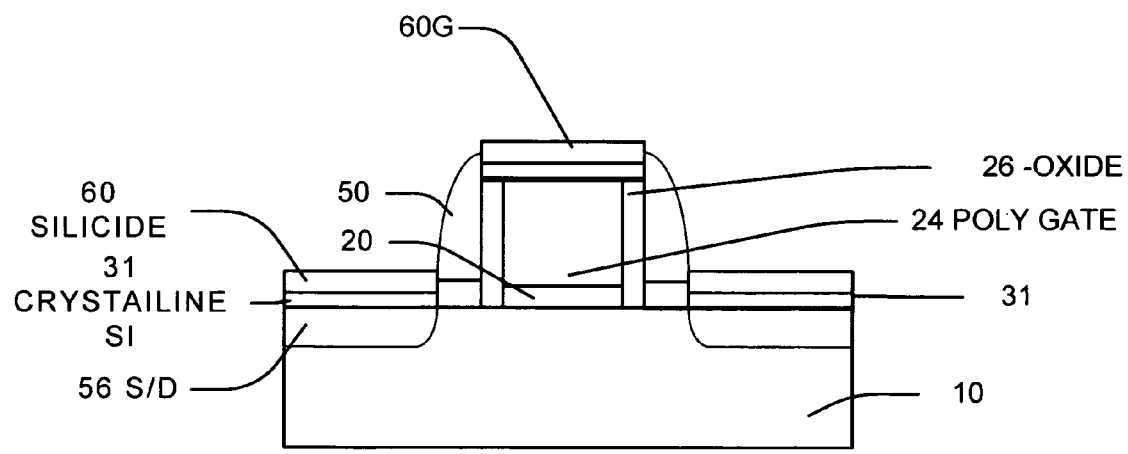

As shown in FIGS. 5A and 6A, in subsequent processing steps are performed to form a FET.

Below is a summary of typical process flow
  spacer formation,
  source drain implantation,
  salicidation,
  IMD deposition,
  contact etch,
  contact formation
  followed by traditional back end process.
As shown in FIG. 5A, sidewall spacers 50 are formed on the gate structure sidewalls.

Source/drain (S/D) regions 56 are formed preferably by a S/D implant process. An optional PAI implant can be performed before the S/D implant to reduce channeling if the embodiment's amorphization implant is not sufficient.

The S/D regions (elevated source/drain regions) 56 are formed in the raised Si region 31 and the substrate 10. The S/D regions are preferably formed using an implant process.

As shown in FIG. 6A, a salicide process is used to form silicide region 60 60G on the Si regions 31 and to gate structure.

Figure 7A:
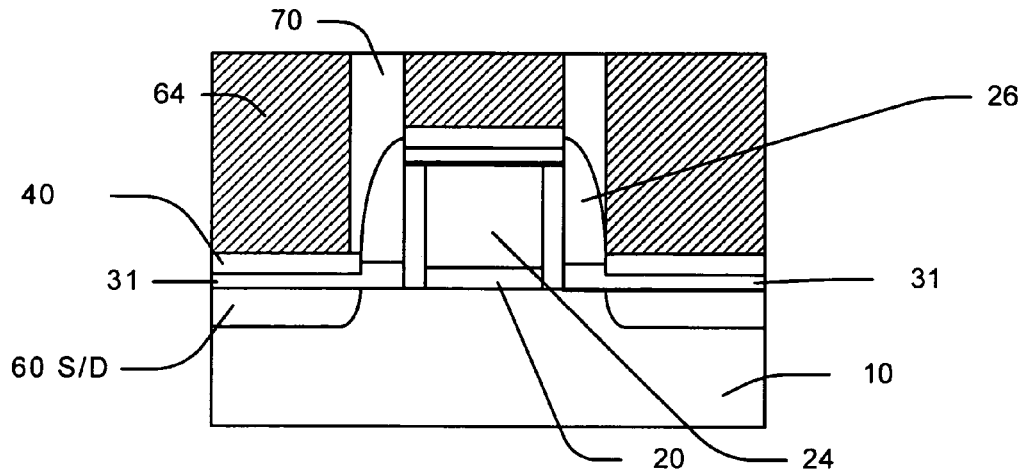
FIG. 6A and FIG. 7A are cross sectional views for illustrating a method for forming elevated source drain regions according an example embodiment of the present invention.

As shown in FIG. 7A, an inter metal dielectric (IMD) layer 64 is formed over the substrate.

Next a contact etch is performed to form opening for contacts.

As shown in FIG. 7A, contacts 68 are formed to contact to the S/D and gate.

This is followed by traditional back end process.

Second Example Embodiment

CVD Deposition of Poly

The second embodiment comprise a chemical vapor deposition (CVD) deposition of poly.

The process begins as described above for the first embodiment as shown in FIG. 1.

Deposit Poly Layer Using CVD Over Gate and Substrate.

Figure 2B:
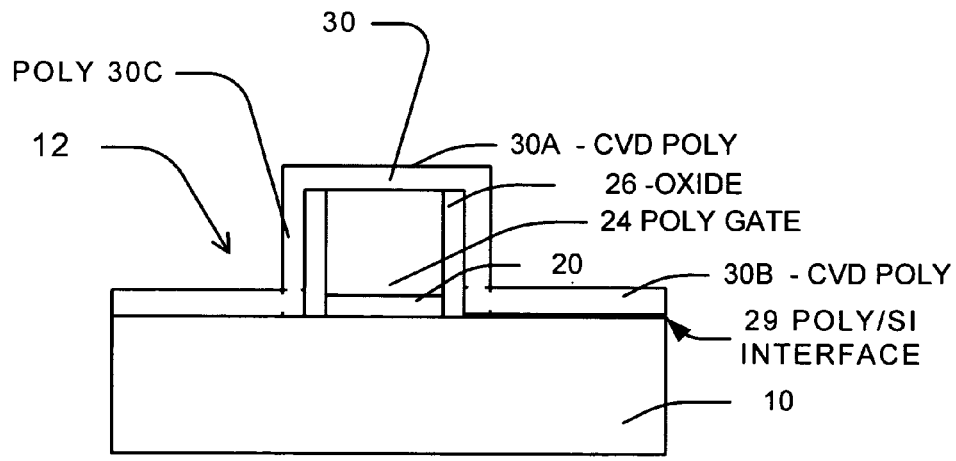

As shown in FIG. 2B, we form a polysilicon layer 30 over the substrate surface and gate. the poly layer is comprised of 3 sections: (a) poly 30A over the top of the gate, (b) poly 30B over the substrate; and (c) poly 30C on the sidewalls of the gate. The CVD deposition process is isotropic and therefore poly 30C forms on the gate structure sidewalls. The CVD deposition process preferably deposits less on the sidewalls than on the substrate and gate.

We deposit a polysilicon layer over the gate structure and substrate.

For CVD process, the polysilicon layer 30 (30A 30B 30C) can be doped or undoped. The poly layer can be doped and then act as a doping source for the S/D regions in the substrate. However, it is preferred that the Source/Drain doping be performed in a subsequent implant step.

The poly layer preferably has a thickness between 200 and 2000 Å.

In CVD process we need to be careful with the source Gas and their pressure and temperature to minimize the deposition on the gate sidewall. Magnetron sputter deposition can be down in room temperature. The chemical vapor deposition (CVD) process is preferably performed at a temperature of 600+/−100 C. degrees and pressure 1 Atm. +/−5%.

Si or Ge Amorphizing I/I (AI) to Amorphize the Si/Poly Interface

As shown in FIG. 3B, in a key step, an Si/Poly interface amorphization implant is performed to create amorphous Si regions 32 at the Si/Poly interface in the source/drain areas 12.

The Si/Poly interface amorphizing implant amorphizes the interface between polysilicon and silicon substrate in the source drain areas 12. The implant also amorphizes the poly 30A over the gate structure 25.

The amorphization implant process is described above.

S/D Doping Process can be Done in the Poly/Si Amorphization Implant Step

The S/D doping process can be done in the poly/Si Amorphization implant step. For example, we us Arsenic to do the process thane it can be used as N+ for the NMOS.

Anneal

Figure 4B:
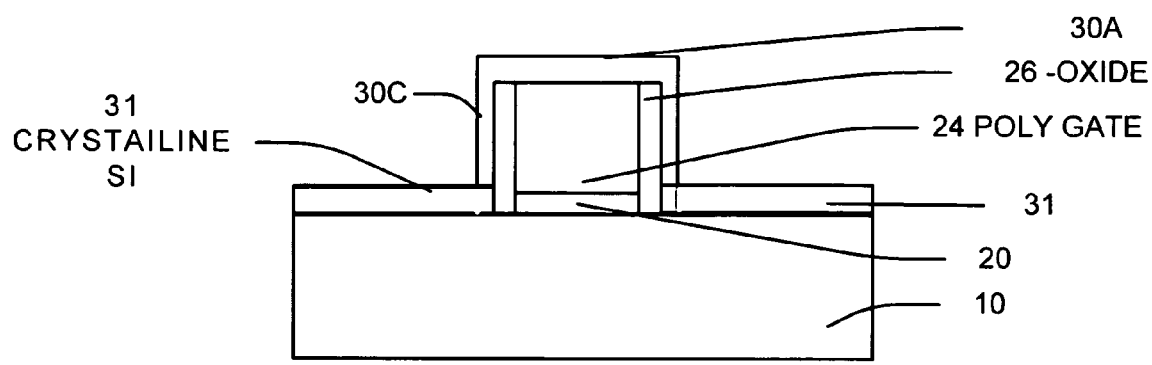

As shown in FIG. 4B, the substrate is annealed. The anneal converts amorphous Si 32 over the crystalline Si substrate 10 and the polysilicon 30B to crystalline Si which forms the raised source and drain regions 31.

The anneal is preferably at a temperature between 500 and 1100° C. The anneal is preferably at a time between 10 min and 60 min.

The raised S/D regions 31 preferably have a thickness between 100 Å and 2000 Å.

Remove Poly 30C on Sidewall Spacer 26

Referring to FIGS. 4B and 5B the poly 30C on the sidewall spacer 26 is removed preferably using an isotropic etch or wet etch. The gate can short to the S/D if the poly 30C is not removed.

In a preferred embodiment, if the poly 30A 30C (poly over non-S/D regions, e.g., poly on the gate) is greater than about 200 Å, the poly 30A 30C is removed. If the poly 30A 30C is less than 200 Å, the poly 30A 30C will react in silicidation step to form silicide. If the poly 30A 30C is thicker than the silicide consumption of silicon, the poly 30A 30C needs to be etched. Traditional wet etch polysilicon $HNO_3:H_2O:HF$ 50:20:1; or a traditional plasma etch polysilicon $CF_4/O_2$ etchant can be used.

Subsequent Process

The wafer undergoes subsequent process to complete the device described for the first embodiment and shown in FIGS. 6A and 7A.

Advantages of the Invention

The embodiments' pre-amorphous implant forms a smooth interface between the silicon and amorphous silicon which help to improve the elevated silicon growth.

Conventional Pre-Amorphous Implants (PAI) processes are after the raise S/D are formed but before the LDD or S/D Implants. Conventional PAI implants form an amorphous region to stop channeling effects from the LDD or S/D I/Is. Therefore Conventional PAI differ physically and in function than the embodiments Poly/Si interface Amorphizing I/I.

CONCLUSION

The embodiments of the invention comprise the following benefits.
1. The amorphous I/I does not affect the channel mobility. Most of the channel area is protected by the gate so the surface mobility does not decrease.
2. The SPE step leads to smooth silicon growth.
3. The elevation depth can be easily tuned by implantation dose.
4. The SD doping process can be done in the poly/Si Amorphization implant step, which increase the flexibility of device tuning. It means the device performance can be tuned easier.
5. All the process is common in the traditional silicon foundry. It is compatible to all silicon technology from big dimension to small dimension.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method for forming elevated source/drain regions comprising the steps of:
   a) forming a gate structure over a substrate; said substrate comprised of silicon;
   b) forming a polysilicon layer over said gate structure and said substrate to form a polysilicon/Si interface between said polysilicon layer and said substrate;
   source/drain areas are adjacent to said gate structure in said polysilicon layer and said substrate;
   c) performing a poly/Si interface amorphization implant to amorphize at least the polysilicon/Si interface in the source/drain areas and to form amorphous regions;
   d) annealing said substrate to crystallize said amorphous regions and said polysilicon layer over said amorphous region to form elevated silicon regions;
   e) forming elevated source/drain regions in said elevated silicon regions
   f) forming silicide regions on said elevated silicon regions.

2. The method of claim 1 wherein said polysilicon layer has a thickness between 200 and 2000 Å.

3. The method of claim 1 wherein said polysilicon layer is formed using a physical vapor deposition process.

4. The method of claim 1 wherein said polysilicon layer is formed using a chemical vapor deposition process.

5. The method of claim 1 wherein said amorphous region has thickness between 100 and 1000 Å; and depth below the polysilicon layer surface between 0 Å and 1900 Å.

6. The method of claim 1 wherein the poly/Si interface amorphization implant comprises an implant species at a dose greater than 1E15 ions/sq-cm.

7. The method of claim 1 wherein said polysilicon layer has a thickness between 350 to 450 Å, and the poly/Si interface amorphizing implant comprises implanting Ge comprises a dose between 2E14 and 6E16 ions/sq cm and preferably about 2E15 ions/sq-cm and energy between 40 keV and 400 keV and at about a 0 degree tilt and about a 0 degree twist angle, and a temperature about room temperature.

8. The method of claim 1 wherein said polysilicon layer has a thickness between 350 to 450 Å, the poly/Si interface amorphizing implant comprises implanting As ions at a dose between 2E16 and 6E16 ions/sq-cm and at an energy between 0.5 and 180 keV.

9. A method for forming elevated source/drain regions comprising the steps of:
   a) forming a gate structure over a substrate; said substrate comprised of silicon;
   b) forming a polysilicon layer over said gate structure and said substrate to form a poly/Si interface between said polysilicon layer and said substrate;
   source/drain areas are adjacent to said gate structure in said polysilicon layer and said substrate;

(1) said polysilicon layer has a thickness between 200 and 2000 Å;
c) performing a polysilicon/Si interface amorphization implant to amorphorize at least the polysilicon/Si interface in the Source/Drain areas and to from an amorphous region;
   (1) said amorphous region has thickness between 100 and 1000 Å; and depth below the surface of said polysilicon layer between 0 and 1900 Å;
   (2) the polysilicon/Si interface amorphization implant comprises an implant at a dose greater than 1E15 ions/sq-cm;
d) annealing said substrate to crystallize said amorphous region and said polysilicon layer over said amorphous region to form elevated silicon regions;
e) implanting ions into said source/drain areas in said elevated silicon regions and said substrate to form raised source/drain regions in said elevated silicon regions and said substrate; and
f) forming silicide regions on said elevated silicon regions.

10. The method of claim 9 wherein said polysilicon layer has a thickness between 350 to 450 Å, the poly/Si interface amorphizing implant comprises implanting Ge comprises a dose between 2E14 and 6E16 ions/sq cm and preferably about 2E15 ions/sq-cm and energy between 40 keV and 400 keV and about 0 degree tilt and about 0 degree twist, and a temp about room temperature.

11. The method of claim 9 wherein said polysilicon layer has a thickness between 350 to 450 Å, and the poly/Si interface amorphizing implant comprises implanting As ions at a dose between 2E16 and 6E16 ions/sq-cm and at an energy between 0.5 and 180 keV.

12. The method of claim 9 wherein said polysilicon layer is formed using a physical vapor deposition process.

13. The method of claim 9 wherein said polysilicon layer is formed using a chemical vapor deposition process.

* * * * *

UNITED STATES PATENT AND TRADEMARK OFFICE
CERTIFICATE OF CORRECTION

PATENT NO. : 7,101,743 B2 Page 1 of 1
APPLICATION NO. : 10/752249
DATED : September 5, 2006
INVENTOR(S) : Yisuo Li et al.

It is certified that error appears in the above-identified patent and that said Letters Patent is hereby corrected as shown below:

Claim 1, col. 8, step c), line 31 add an -- ; -- after "regions".

Claim 7, col. 8, line 49, please replace "comprises" after "Ge" with -- at --.

Claim 7, col. 8, line 50, please add -- an -- before "energy".

Claim 9, col. 9, line 5, please replace "from" with -- form --.

Claim 10, col. 10, line 3, please replace "comprises" after "Ge" with -- at --.

Claim 10, col. 10, line 5, please add -- an -- before "energy".

Signed and Sealed this

Twentieth Day of March, 2007

JON W. DUDAS
*Director of the United States Patent and Trademark Office*